(12) United States Patent
Shigemura et al.

(10) Patent No.: US 7,372,075 B2
(45) Date of Patent: May 13, 2008

(54) OPTICAL SUBSTRATE, LIGHT EMITTING ELEMENT, DISPLAY DEVICE AND MANUFACTURING METHODS THEREOF

(75) Inventors: Koji Shigemura, Tokyo (JP); Tomohisa Gotoh, Tokyo (JP); Hironori Imura, Tokyo (JP)

(73) Assignee: NEC Corporation, Tokyo (JP)

( * ) Notice: Subject to any disclaimer, the term of this patent is extended or adjusted under 35 U.S.C. 154(b) by 62 days.

(21) Appl. No.: 11/172,597

(22) Filed: Jun. 30, 2005

(65) Prior Publication Data

US 2006/0012901 A1 Jan. 19, 2006

(30) Foreign Application Priority Data

Jul. 15, 2004 (JP) ............................. 2004-208718

(51) Int. Cl.
*H01L 29/04* (2006.01)
*H01L 29/10* (2006.01)
*H01L 31/00* (2006.01)

(52) U.S. Cl. ........................... 257/59; 257/72; 257/83; 257/E51.022; 257/E33.064

(58) Field of Classification Search ...................... None
See application file for complete search history.

(56) References Cited

U.S. PATENT DOCUMENTS

| | | | |
|---|---|---|---|
| 6,740,416 B1* | 5/2004 | Yokogawa et al. | 428/446 |
| 2003/0116719 A1* | 6/2003 | Miyazawa | 250/484.2 |
| 2003/0160247 A1 | 8/2003 | Miyazawa | |
| 2003/0213966 A1* | 11/2003 | Yang et al. | 257/93 |

FOREIGN PATENT DOCUMENTS

| | | |
|---|---|---|
| CN | 1423510 A | 6/2003 |
| CN | 1429054 A | 7/2003 |
| JP | 2001-202827 | 7/2001 |
| JP | 2002-275430 | 9/2002 |
| JP | 2002-277609 | 9/2002 |
| JP | 2002-278477 | 9/2002 |
| JP | 2004-022438 | 1/2004 |
| JP | 2004-031350 | 1/2004 |
| JP | 2004-109966 | 4/2004 |
| JP | 2004-139979 | 5/2004 |

OTHER PUBLICATIONS

T. Tsutsui, "Doubling Coupling-Out Efficiency in Organic Light-Emitting Devices Using a Thin Silica Aerogel Layer", Adv. Mater. 2001, 13, No. 15, Aug. 3, pp. 1149-1152.

* cited by examiner

*Primary Examiner*—Minhloan Tran
*Assistant Examiner*—Leslie Pilar Cruz
(74) *Attorney, Agent, or Firm*—Scully, Scott, Murphy & Presser, P.C.

(57) ABSTRACT

The present invention relates to an optical substrate comprising a transparent substrate, a low refractive index layer, whose refractive index is lower than that of the transparent substrate, disposed over the transparent substrate, and a solgel film disposed over the low refractive index layer; a light emitting element having a first electrode, a light emitting layer and a second electrode over the solgel film of this optical substrate; and a display device provided with this light emitting element.

32 Claims, 8 Drawing Sheets

OPTICAL SUBSTRATE, LIGHT EMITTING ELEMENT, DISPLAY DEVICE AND MANUFACTURING METHODS THEREOF

BACKGROUND OF THE INVENTION

1. Field of the Invention

The present invention relates to an optical substrate for light emitting elements, a light emitting element using it, a display device using the light emitting element, and manufacturing methods thereof.

2. Description of the Related Art

Along with the advance of information and communication technology over the recent years, diverse display devices have been developed. Among them is the self-luminescent organic electroluminescence (EL) element, which is attracting interest for its high display quality and thinness.

The organic EL element is a self-luminescent element embodying the principle that recombination energy between holes injected from the anode and electrons injected from the cathode causes fluorescent substance to emit light by applying an electric fields. Since a report was published on a laminated low voltage-driven organic EL element, many research attempts have been made on organic EL elements composed of one organic material or another. One example is an element using tris(8-quinolinol) aluminum for the light emitting layer and a triphenyldiamine derivative for the hole transport layer. Advantages of the laminated structure include enhanced efficiencies of hole injection into the light emitting layer and of the generation of exciters, the latter being generated from a recombination by blocking the electrons injected from the cathode, and the enclosure of exciters generated within the light emitting layer. Other known element structures for organic EL elements such as the two-layered one cited above include a three-layered structure comprising a hole transport layer, a light emitting layer and an electron transport layer. These laminated elements embody many contrivances in element structure or formation method intended to enhance the efficiency of recombination of injected holes and electrons. Also, the wavelength of emitted light can be changed by using a different material for the light emitting layer.

However, in an organic EL element, there is a constraint to the probability of singlet generation due to the dependence of spin statistics at the time of carrier recombination, resulting in an upper limit to light emitting efficiency. The level of this upper limit is known to be about 25%. When an iridium complex is used as the dopant material for the light emitting layer, luminescence from the triplet exciter of iridium arises at a high probability and this, combined with the utilization of the singlet exciter, enables exciter generation at a high probability of 75 to 100%.

Incidentally, organic EL elements and the like confine light by a total reflection effect as an optical phenomenon characteristic of them. As the refractive index of the light emitting layer or the transparent electrode is higher than that of the substrate or air, light whose angle of emission is at or above a critical angle is totally reflected by the transparent electrode/substrate interface or the substrate/air interface, and cannot be extracted out of the substrate. Supposing that the refractive index of the organic layer including the emitting layer is 1.6, that of the transparent electrode 2.0 and that of the substrate 1.5, the quantity of light emitted outside, namely the efficiency of light extraction is no more than 20% or so. For this reason, the limit of energy conversion efficiency is never high, only about 5% including the probability of singlet generation or, even if the triple exciter is utilized, no more than 15 to 20% in total. This poses a problem not only to organic EL elements but also to plane-light emitting elements in general, whose light emitting material discharges light.

As a method to enhance this light extraction efficiency, it is proposed in Patent Document 1 (Japanese Patent Laid-Open No. 2001-202827) to arrange a low refractive index layer between the substrate and the transparent electrode, and this laminated structure is shown in FIG. 11. According to this disclosed method, the presence of a transparent electroconductive film (transparent electrode layer) 302 in contact with at least one surface of a low refractive index body 301 serves to enhance the rate of extracting the light passing the low refractive index body 301 into the atmosphere and this enhanced rate of extracting the light outside, and the refractive index 1.003 to 1.300 of the low refractive index body 301 enable the light passing the low refractive index body 301 to be more efficiently extracted into the atmosphere, resulting in a higher extracting ratio of light to be extracted to the outside. Furthermore, an ultra-low refractive index dose to 1 is realized by using silica aerogel for the low refractive index body 301.

Also, Patent Document 2 (Japanese Patent Laid-Open No. 2002-278477) discloses an invention by the same inventor in which the light emitting element of Patent Document 1 is applied to a thin film transistor (TFT) substrate. According to this disclosed technique, a low refractive index layer on the other side surface of the transparent electroconductive layer than the light emitting layer is within a range of 1.01 to 1.3.

Further, Non-Patent Document 1 (T. Tsutsui, Adv. Mater. 2001, 13, No. 15, August 3, pp. 1149-1152) discloses a structure in which an organic EL element is provided over a substrate having a silica aerogel film of 10 μm in thickness arranged as the low refractive index layer, a silicon oxide ($SiO_2$) film of 50 nm in thickness arranged over the silica aerogel film, and a transparent electrode (ITO) of 100 nm in thickness arranged over the silicon oxide film. The silicon oxide film here is formed by sputtering. The reference states that the external quantum efficient of the disclosed structure is 1.8 times higher than that of an element structure having no silica aerogel film.

However, the above related arts leave room for improvement in the following respects.

The structures described in Patent Documents 1 and 2, in which a low refractive index layer is arranged between the substrate and the transparent electrode layer, are effective in that the efficiency of light extraction is enhanced by collecting the light within a critical angle, but the reflection of light by the interface between the transparent electrode and the low refractive index layer makes the enhancement of light extraction efficiency still insufficient. When a porous silica aerogel film is used to obtain an ultra-low refractive index layer, the mechanical strength of the film is extremely weak. Further, when the transparent electrode is patterned in a wet process, the etchant flowing round from the porous silica aerogel film makes it difficult to form the prescribed pattern. Moreover, the surface roughness of the porous film invites inter-electrode leaks and pixel short, giving rise to unstable light emission or failure to emit light. Thus, these techniques are still inadequate as light extraction methods that can be applied to organic EL elements.

The method described in Non-Patent Document 1 by which a silicon oxide film is formed by sputtering over a silica aerogel film of 10 μm in thickness is also inadequate in that the sputtered film does not serve to improve surface roughness of the silica aerogel film, and similarly invites interelectrode leaks and pixel short. Further it is difficult to form a silica aerogel film as thick as 10 μm with sufficient uniformity, and accordingly element characteristics are susceptible to fluctuation. If this method is to be applied to a display device provided with a thin film transistor (TFT), the 10 μm film thickness will make it difficult to form contact holes needed for connecting the pixel electrode and the source electrode of the TFT, making the intended application impossible.

SUMMARY OF THE INVENTION

An object of the present invention is to solve the problems of the prior art stated above and provide an optical substrate for light emitting elements excelling in light extraction efficiency, a light emitting element using it, and a display device using the light emitting element. In particular, the invention is intended to provide a reliable light emitting element and display device with high yield, and a display device of high grade picture quality and high resolution.

An optical substrate according to the invention comprises a transparent substrate, a low refractive index layer, whose refractive index is lower than that of the transparent substrate, disposed over the transparent substrate, and a solgel film disposed over the low refractive index layer.

A light emitting element according to the invention comprises a transparent substrate, a low refractive index layer, whose refractive index is lower than that of the transparent substrate, disposed over the transparent substrate, a solgel film disposed over the low refractive index layer, a first electrode over the solgel film, a light emitting layer over the first electrode, and a second electrode over the light emitting layer.

A display device according to the invention comprises a light emitting element and means for driving the light emitting element, which are disposed over the transparent substrate, wherein the light emitting element comprises a low refractive index layer, whose refractive index is lower than that of the transparent substrate, disposed over the transparent substrate, a solgel film disposed over the low refractive index layer, a first electrode over the solgel film, a light emitting layer over the first electrode, and a second electrode over the light emitting layer. The plurality of light emitting elements in this display device can be formed in a matrix shape.

According to the invention, the light extraction efficiency is significantly improved by the solgel film disposed over the low refractive index layer. The solgel film serves to ease the surface roughness of the low refractive index layer, reduces the diffuse reflection arising on the interface between the low refractive index layer and the transparent electrode, and can thereby significantly improve the light extraction efficiency.

According to the invention, the refraction index of the low refractive index layer can be set between 1.003 and 1.400.

According to the invention, silica aerogel can suitably used for the low refractive index layer.

According to the invention, materials that have an Si—O—C structure can be suitably used for the solgel film.

According to the invention, materials that have in its infrared absorption spectrum an absorption of $1107\pm2$ cm$^{-1}$ in wave number attributable to Si—O—C can be used for the solgel film.

According to the invention, materials that have in its infrared absorption spectrum an absorption A of $1107\pm2$ cm$^{-1}$ in wave number attributable to Si—O—C and an absorption B of $1070\pm2$ cm$^{-1}$ in wave number attributable to Si—O—Si, and the intensity ratio A/B between the absorption A and the absorption B ranging from 0.5 to 1.0 can be suitable used for the solgel film.

According to the invention, a relationship between the surface roughness of the low refractive index layer represented by Ra1 and that of the solgel film over the low refractive index layer represented by Ra2 can be Ra1>Ra2.

According to the invention, the refractive index of the solgel film can be greater than that of the low refractive index layer.

According to the invention, the thickness of the solgel film can be between 0.05 and 1.0 μm.

According to the invention, the solgel film can be formed by using a precursor having an Si—H group.

According to the invention, a plastic substrate can be suitably used as the transparent substrate.

According to the invention, a barrier layer can be further disposed over the solgel film and the first electrode is disposed over the barrier layer.

According to the invention, the transparent substrate can be a substrate provided with a thin film transistor.

The light emitting element according to the invention can be so composed that light emission from the light emitting layer be monochromatic. Further this monochromatic light can be either white light or blue light.

The light emitting element according to the invention can be applied to many different types of optical elements including light emitting diode elements, plasma display elements and so forth besides organic EL elements and inorganic EL elements.

The display device according to the invention can be a TFT display device provide with an electronic circuit comprising a thin film transistor (TFT) and other elements as the driving means.

The display device according to the invention can have a configuration having a level gap easing film for easing a convex attributable to the electronic circuit comprising a TFT and other elements.

The display device according to the invention can be so configured as to keep the film thickness of the low refractive index layer at or below 4 μm.

A method of manufacturing an optical substrate according to the invention comprises the steps of disposing a low refractive index layer over a transparent substrate; coating solgel film over the low refractive index layer; and increasing the density of the solgel film by irradiation with ultraviolet rays after drying. The light emitting element can be provided over this solgel film. The low refractive index layer can be disposed over the transparent substrate provided with driving means.

The present invention can provide the following advantages.

A first advantage is to reduce with the solgel film disposed over the low refractive index layer the diffuse reflection arising on the interface of the low refractive index layer, and thereby significantly improve the light extraction efficiency of the optical substrate. The use of this optical substrate makes it possible to provide a light emitting element and a display device of high light emitting efficiency, in other words high luminance, yet consuming less electric power.

A second advantage is that, as the surface roughness of the low refractive index layer is eased by the solgel film, inter-electrode leaks or pixel short can be restrained even where a light emitting layer of a very thin film thickness is used such as in the organic EL element, with the result that it is possible to provide a light emitting element and a display device of high luminance, yet consuming less electric power, and moreover excelling in production yield and reliability.

A third advantage is that a level gap easing layer for the elimination of the convex attributable to the means of driving the light emitting element, such as a TFT, makes it possible to form the low refractive index layer free from unevenness of film thickness and cracking, with the result that it is possible to provide a display device of high luminance, yet consuming less electric power, excelling in production yield, in reliability and moreover in picture quality.

A fourth advantage is that because of the possibility to obtain a light emitting element manifesting a high light emitting efficiency even with a low refractive index layer of a film thickness of 4 μm or below, even 1 μm or below, the contact hole size can be kept very small, with the result that it is possible to provide a display device of high luminance, yet consuming less electric power, excelling in production yield, in reliability and in picture quality with the additional benefits of making available very fine contact holes in a high proportion.

A fifth advantage is that the presence of an Si—H group in the precursor to the solgel film means that optical reaction by irradiation with ultraviolet rays can be used for setting the solgel film. As this makes possible a low temperature process, which can be applied to plastic substrates not very resistant to heat, it is possible to provide a light, thin and flexible optical substrate, and a light emitting element and a display device with a high light emitting efficiency.

DETAILED DESCRIPTION OF THE PREFERRED EMBODIMENTS

Preferred embodiments of the present invention will be described in detail below with reference to accompanying drawings.

First Embodiment

Figure 1:
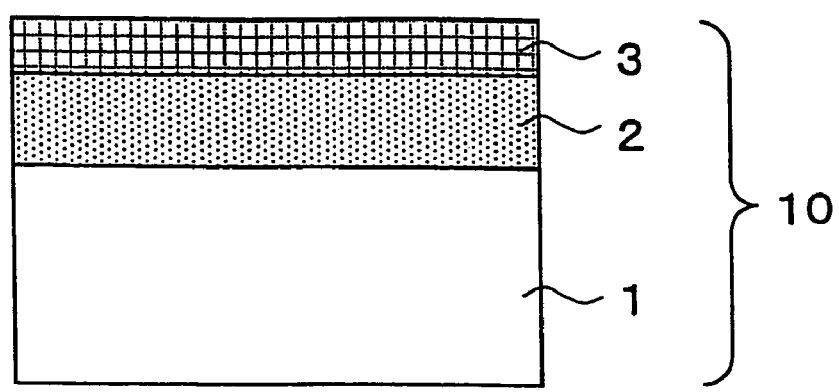
FIG. 1 shows a sectional view of an example of optical substrate according to the present invention.

FIG. 1 shows a sectional view of an optical substrate as a first embodiment of the invention. Thus, an optical substrate 10 according to the invention is provided with a low refractive index layer 2 on one face of a transparent substrate 1 and a solgel film 3 on the low refractive index layer 2.

Figure 2:
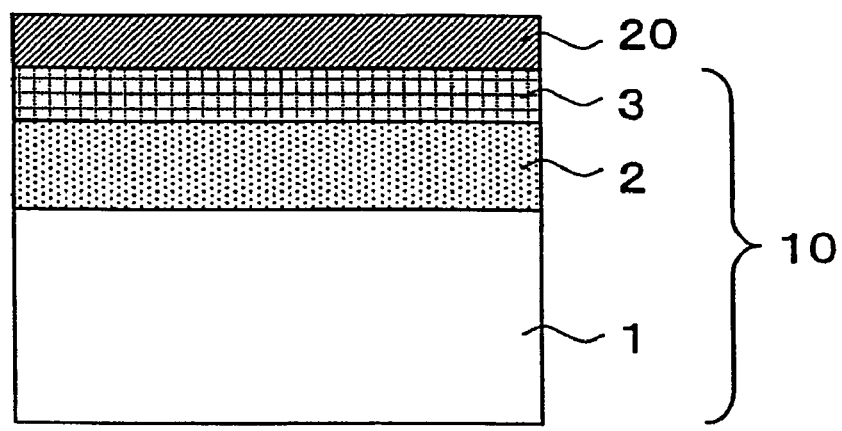
FIG. 2 shows a sectional view of another example of optical substrate according to the invention.

FIG. 2 shows a sectional view of a substrate configured by disposing a first electrode layer 20 in contact with the upper face of the optical substrate of FIG. 1.

Figure 11:
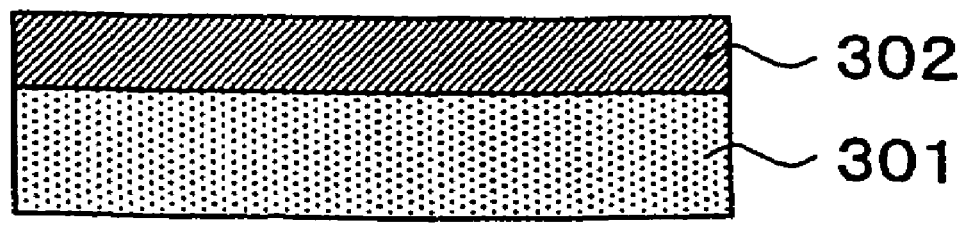
FIG. 11 shows a sectional view of a conventional optical substrate.

This optical substrate, mounted with a light emitting area above the solgel film 3, is used as the substrate for a light emitting element. The solgel film 3 alleviates the surface roughness of the low refractive index layer 2, reduces the diffuse reflection arising on the interface between the low refractive index body 301 and the transparent electrode 302, where no solgel film is present as seen in FIG. 11, and can thereby serve to significantly improve the light extraction efficiency. In other words, two interfaces including that between the low refractive index layer 2 and the solgel film 3 and that between the solgel film 3 and the first electrode layer 20 constitute an important element pertaining to this embodiment of the invention.

Constituent parts of the optical substrate pertaining to this embodiment will be described in detail below.

The transparent substrate 1 is used as the light extraction substrate of the light emitting element. It transmits at least some wavelengths in the visible radiation range. It is sufficient for the transparent substrate 1 in this embodiment to transmit lights of at least some wavelengths between 400 and 800 nm, and its material may be either inorganic or organic. Available inorganic materials include glass, and organic materials, plastics. Among the usable types of glass include optical glasses such as fused silica, non-alkali glass, soda glass or heavy flint glass. Plastics usable for the purpose include engineering plastics such as polyether sulfone (PES) or polyethylene terephthalate (PET). The appropriate refractive index of the transparent substrate 1 ranges from 1.4 to 2.1. The transparent substrate 1 may be coated with a barrier layer to restrain the permeation of moisture and oxygen. It is desirable for the thickness of the transparent substrate 1, though not limited to, to be 0.1 to 2.0 mm from a practical point of view.

A transparent material lower than the transparent substrate 1 in refraction index is used for the low refractive index layer 2. Like the transparent substrate, this layer may pass lights of at least some wavelengths between 400 and 800 nm. Its desirable refractive index ranges from 1.003 to 1.400. There is a limit to keep the refractive index low, and 1.003 is considered the practical limit. The most preferable material for the low refractive index layer is silica aerogel.

Silica aerogel can be produced by drying a gelatinous compound in a wet state, having a silica frame obtained by hydrolyzing alkoxysilane and polymerizing the hydrolyzed product, in the presence of alcohol or some other solvent in a supercritical state beyond the critical point of this solvent.

It is sufficient for the solgel film 3, like the transparent substrate 1 and the low refractive index layer 2, to pass lights of at least some wavelengths between 400 and 800 nm. Herein, as a sol solution made of an alkoxide of silicon or a metal such as titanium, water, acid, alcohol and the like can be used, but an silicon-based alkoxide is preferable in view of a degree of transparency and handling ease.

Figure 3:
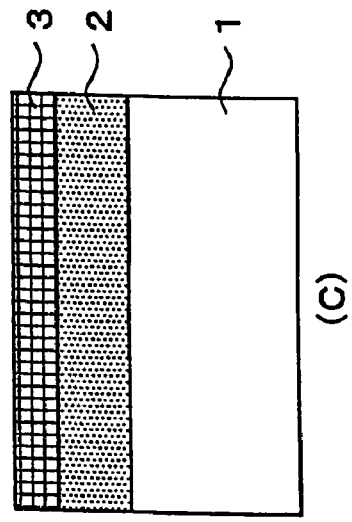
FIG. 3 is a process diagram charting the manufacturing method of the optical substrate according to the invention.
Figure 3:
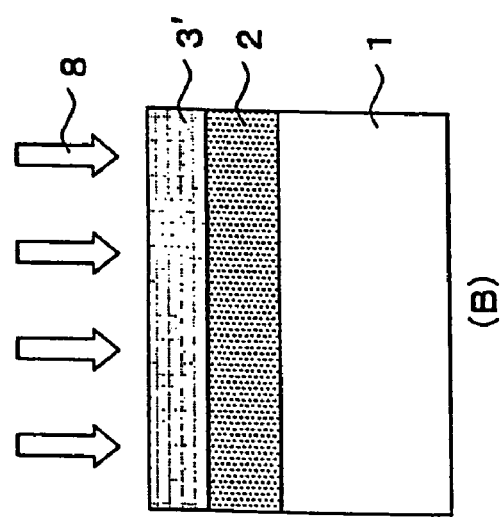
Figure 3:
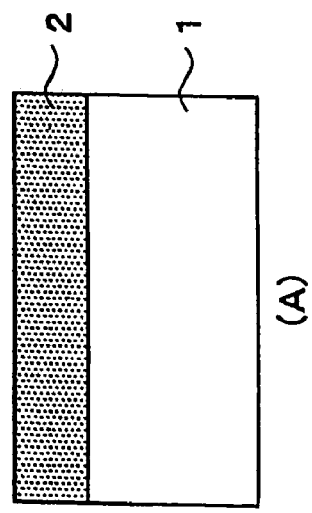

FIG. 3 shows one example of manufacturing method of the optical substrate of this embodiment of the invention. FIG. 3(A) shows a state in which the low refractive index layer 2 is disposed over the transparent substrate 1. Beginning with this state, the low refractive index layer 2 is coated with a solgel film as shown in FIG. 3(B), the solvent is removed by drying, and a precursor 3' to the solgel film is thereby obtained. Then, the precursor 3' to the solgel film is irradiated with ultraviolet rays 8 to accelerate reactions in the solgel film, such as condensation. The solgel film 3, which is less in film thickness, in other words is denser, than the precursor 3' to the solgel film is obtained as shown in FIG. 3(C). It is also possible here to heat the precursor 3' when it is irradiated with ultraviolet rays. The heated ambiance might further increase the density. The light emitting element and the display device embodying the invention in this mode can be manufactured by a similar method. Ultraviolet rays of any wavelength can be used if they can be absorbed by the precursor 3' to the solgel film. An effective source for the ultraviolet rays can be selected from a xenon lamp, xenon mercury lamp, mercury lamp, excimer lamp, excimer laser, YAG laser and so forth. An excimer lamp would be particularly effective for the optical substrate according to the invention, and particularly preferable ones include a $Xe_2$ lamp of 172 nm in wavelength, a $Kr_2$ lamp of 146 nm in wavelength and an $Ar_2$ lamp of 126 nm in wavelength.

Figure 4:
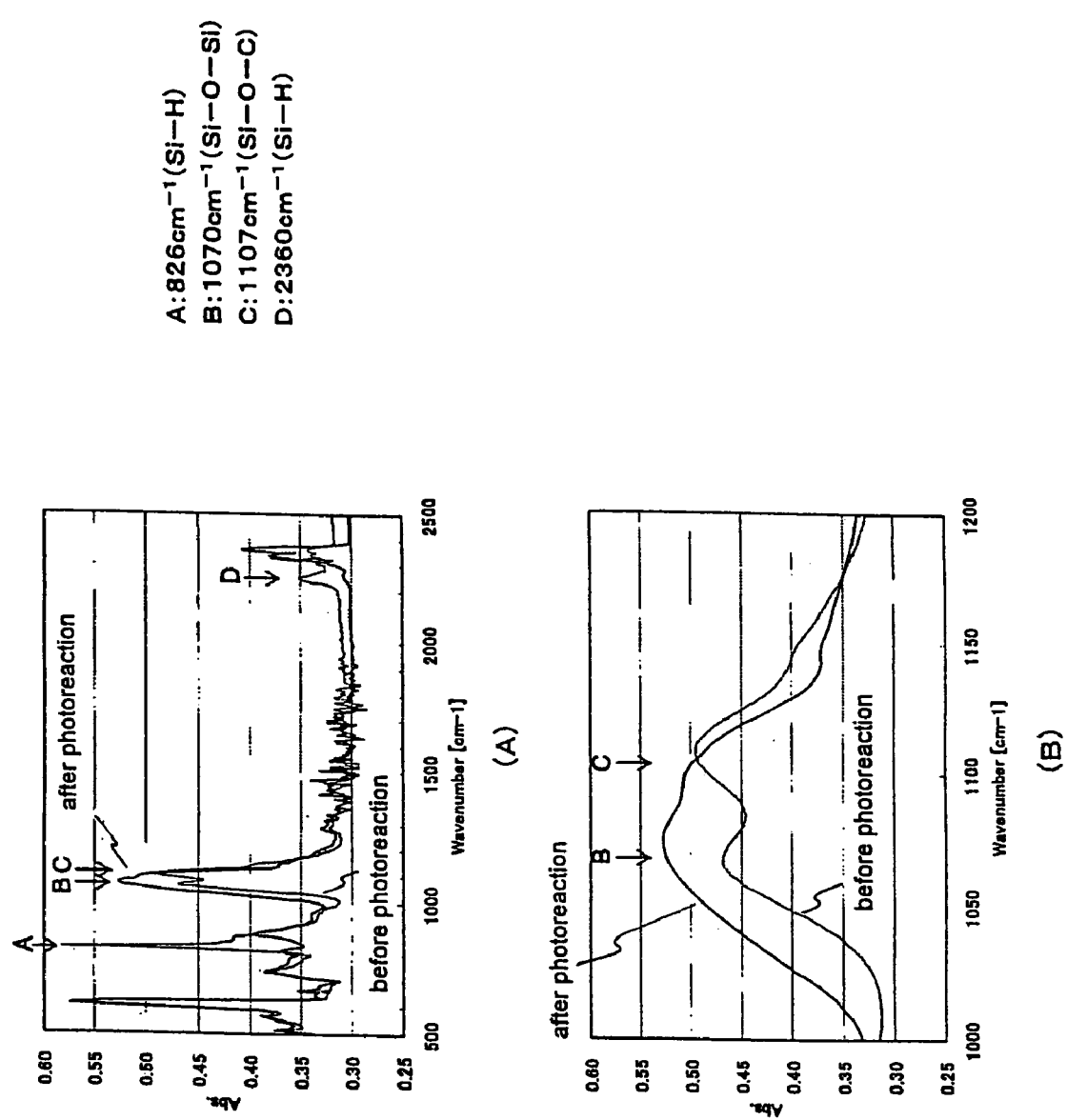
FIG. 4 shows an infrared absorption spectrum before and after the photoreaction of a solgel film.

FIG. 4 shows an infrared absorption spectrum before and after the photoreaction to form the solgel film 3, which in this case is made of a silicon-based alkoxide. In FIG. 4(A), A represents the absorption peak of Si—H of 826±2 $cm^{-1}$; B, that of Si—O—Si of 1070±2 $cm^{-1}$; C, that of Si—O—C of 1107±2 $cm^{-1}$; and D, that of Si—H of 2360±2 $cm^{-1}$. FIG. 4(B) shows an expanded view of the area in FIG. 4(A) where the wave number is from 1000 to 1200 $cm^{-1}$. The solgel film 3 would usually be set by an photoreaction or a thermal reaction; comparison of the absorption peaks before and after the photoreaction due to irradiation with ultraviolet rays earlier described with reference to the manufacturing method, reveals that the peak of 826 $cm^{-1}$ in wave number attributable to Si—H is found significantly lower after the photoreaction. This can be explained by the fact that the precursor to the solgel film has a high content of highly optically reactive Si—H groups, and these Si—H groups are almost eliminated by the photoreaction due to irradiation with ultraviolet rays. However, the presence of any Si—H group in the solgel film after irradiation with ultraviolet rays poses no problem.

Figure 8:
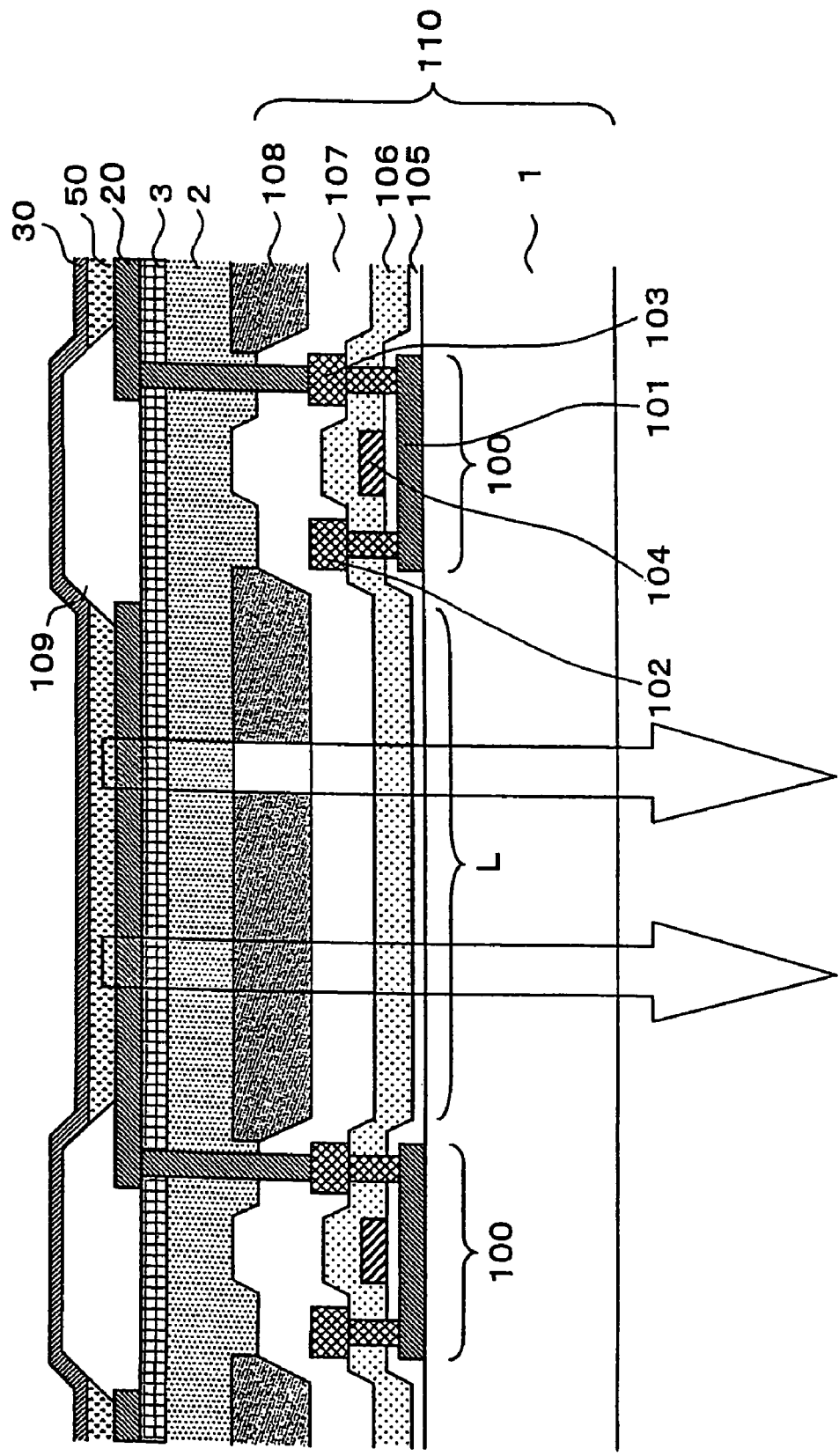
FIG. 8 shows a sectional view of another example of display device according to the invention.

By utilizing this photoreaction due to irradiation with ultraviolet rays, a low-temperature setting process is made possible. This enables a material poor in temperature-tolerance, such as plastics, for the transparent substrate, and thereby contributes to expand the scope of options for the substrate material. As a result, it is made possible to easily obtain flexible light-weight optical substrate that can be reduced in thickness and light emitting elements highly efficient in light extraction using such optical substrates. Even for a substrate in which a thin film transistor (TFT) as shown in FIG. 8 is formed by a low-temperature process, there are advantages of reducing the deterioration of TFT characteristics and reliability. As a result, it is made easier to provide a light-weight and flexible display device permitting a reduction in thickness, which also excels in luminance, quality and reliability.

Referring again to FIG. 4, there remains an absorption peak of Si—O—C after the reaction of the solgel film 3. When a silica aerogel film is used as the low refractive index layer, since there also is an absorption peak of Si—O—C in the silica aerogel film, an advantage of high chemical affinity is achieved by using a silicon-based alkoxide for the solgel film 3. It is preferable for the absorption peak of Si—O—C to have an intensity ratio (absorbance ratio: Si—O—C/Si—O—Si) of 0.5 to 1.0 to the absorption peak of Si—O—Si. A greater value of this intensity ratio than 1.0 means an insufficient condensing reaction of the solgel film.

The optical substrate pertaining to this embodiment of the invention is fabricated by successively stacking the low refractive index layer 2 and the solgel film 3 over the transparent substrate 1. The light emitting element pertaining to this embodiment is fabricated by stacking at least a first electrode 20 and a light emitting layer over the optical substrate. For this reason, if the surface of the transparent substrate 1 is uneven, the unevenness will affect the first electrode 20 and the light emitting layer, inviting current leaks and short circuiting between electrodes. Therefore, it is preferable to use a flat transparent substrate 1. However, many of the materials available for the low refractive index layer 2 are porous in film quality, as is typically found in silica aerogel, and not insignificant in surface roughness. Then, where the surface roughness of the low refractive index layer 2 is represented by Ra1 and that of the solgel film 3 over the low refractive index layer 2 by Ra2, a relationship of Ra1>Ra2 should hold between them. The surface roughness here is defined in terms of the center line average roughness. Therefore, it is possible enhance the efficiency of light extraction by smoothening the base of the first electrode 20 to restrain current leaks and short circuiting which occur between electrodes and, at the same time reducing the diffuse reflection arising on the two interfaces, one between the low refractive index layer 2 and the solgel film 3 and the other between the solgel film 3 and the first electrode layer 20.

Further, in order to ease the unevenness of the low refractive index layer 2 with the solgel film 3 and reduce the surface roughness of the solgel film 3, finer film quality than the porous one is required. Generally speaking, finer the film quality, the greater the refractive index. Therefore, it is preferable for the refractive index of the solgel film 3 to be greater than that of the low refractive index layer.

Though the appropriate thickness of the solgel film 3 ranges from 0.05 to 1.0 µm, it is more preferable for the thickness to be between 0.05 and 0.5 µM and still more preferable to be between 0.05 and 0.3 µm. If it is less than 0.05 µm, it will be difficult to ease the unevenness of the low refractive index layer 2, namely to reduce Ra2 mentioned above. If the thickness is greater than 1.0 µm thickness irregularities or cracks due to factors during film formation are will be more likely to occur, inviting destabilization of optical characteristics.

In this embodiment, the use of a transparent electroconductive material, such as indium tin oxide (ITO) alloy or antimony-doped tin oxide (ATO) for the solgel film 3 makes possible using it as an auxiliary electrode to reduce the resistance of the first electrode layer 20.

Second Embodiment

This embodiment of the invention is an example in which the optical substrate described with reference to the first embodiment is used for an organic electroluminescence (EL) element.

Figure 5:
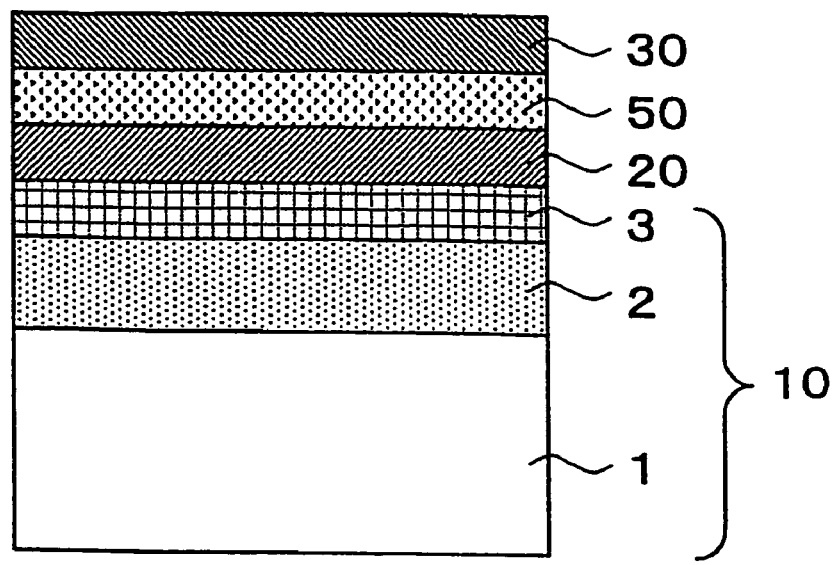
FIG. 5 shows a sectional view of an example of optical element according to the invention.

FIG. 5 shows a sectional view of an example of organic EL element pertaining to this embodiment of the invention. The first electrode 20, an organic light emitting layer 50 and a second electrode 30 are successively provided over the optical substrate 10. The organic light emitting layer 50 here consists of one or more layers. Its possible structures having a plurality of layers include a two-layered structure consisting of a hole transport layer and a light emitting layer or a light emitting layer and an electron transport layer; a three-layered structure consisting of a hole transport layer, a light emitting layer and an electron transport layer; a four layered structure consisting of a hole injection layer, a hole transport layer, a light emitting layer and an electron transport layer; and a five-layered structure consisting of a hole injection layer, a hole transport layer, a light emitting layer, a hole blocking layer and an electron transport layer. The cathode may be provided on the light emitting layer side with a buffer layer of a low work function metal, a fluoride or the like. Incidentally, the organic EL element in this embodiment can either be a low molecular type or a high molecular type. The optical substrate of the organic EL element is so arranged in this embodiment that the light emitted from the light emitting layer pass the optical substrate.

A wide variety of materials are available for use in hole transport. In specific terms, there are diamine derivatives including N,N'-diphenyl-N, N'-bis(3-methylphenyl)-1,1'-biphenyl-4,4'-diamine (abbreviated to TPD) and N,N'-diphenyl-N,N'-bis(α-naphthyl)-1,1'-biphenyl-4,4'-diamine (abbreviated to α-NPD); 4,4',4''-tris(3-methylphenylphenylamino)-triphenylamine; and star burst type molecules.

Materials for electron transport are also available in a wide variety. Specifically, there are tris(8-quinolinol) aluminum complex (Alq3); oxadiazole derivatives including 2-(4-biphenylyl)-5-(4-t-butylphenyl)-1,3,4-oxadiazol and bis{2-(4-t-butylphenyl)-1,3,4-oxadiazol}-m-phenylene; triazole derivatives; and quinolinol-based metallic complexes.

Available light emitting materials include, for instance, tris(8-quinolinol) aluminum complex (Alq3), bisdiphenylvinylbiphenyl (BDPVBi), 1,3-bis(p-t-butylphenyl)-1,3,4-oxadiazolil) phenyl (OXD-7), N,N'-bis(2, 5-di-t-butylphenyl) perylenetetracarboxylic diimide (BPPC) and 1,4 bis(p-tolyl-p-methylstyrylphenyl) naphthalane. A layer formed by doping a charge transport material with a fluorescent material can also be used as the light emitting material. For instance, it is possible to use a layer formed by doping a quinolinol metal complex, such as Alq3 mentioned above with 4-dicyanomethylene-2-methyl-6-(p-dimethylaminostyryl)-4H-pyran (DCM), a quinacridon derivative such as 2,3-quinacridon [7], a coumarin derivative such as 3-(2'-benzothiazole)-7-diethylaminocoumarin, perylene, dibenzonaphihacene or benzopyrene; a layer formed by doping an electron transport material consisting of a bis (2-methyl-8-hydroxyquinoline)-4-phenylphenol-aluminum complex with a condensed polycyclic aromatic compound such as perylene; or a layer formed by doping a hole transport material consisting of 4,4'-bis (m-tolylphenylamino) biphenyl (TPD) with rubrene or the like.

In the element shown in FIG. 5, the first electrode 20 performs the role of injecting holes into the hole transport layer or the light emitting layer, and should preferably have a work function of 4.5 eV or more. Available materials for the first electrode 20 used in this embodiment include transparent electroconductive materials such as indium tin oxide (ITO) alloys and indium zinc oxide (IZO) alloys. The second electrode 30 performs the role of injecting electrons into the electron transport layer or the light emitting layer, and should preferably have a low work function. The material for a cathode 120 in specific terms may be, though not limited to, indium, aluminum, magnesium, magnesium-indium alloy, magnesium-aluminum alloy, aluminum-lithium alloy, aluminum-scandium-lithium alloy, magnesium-silver alloy or the like.

Incidentally, the organic EL element of this embodiment can as well be either passively driven or actively driven with an active element, such as a thin film transistor (TFT), being added.

The methods of forming the layers constituting the organic EL element of this embodiment are not limited to any specific ones, but can be appropriately selected from known ones, such as vacuum deposition, molecular beam epitaxy (MBE), and coating methods including dipping in a solution dissolved in a solvent, spin coating, casting, bar coating and roll coating.

In this embodiment, the optical substrate 10 can enhance light extraction efficiency in the visible radiation range without depending on the wavelength of the emitted light. Therefore, a high-efficiency area color element or a high-efficiency full color element can be obtained by using materials independently emitting red, green and blue colors as the organic light emitting layer 50; a high-efficiency color filter type organic EL element using a white light emitting layer 70 shown in FIG. 6 or a high-efficiency color conversion type organic EL element using a blue light emitting layer 80 shown in FIG. 7 can be also obtained. The white light emitting layer or the blue light emitting layer may be configured of a plurality of layers like the ones described above.

Figure 6:
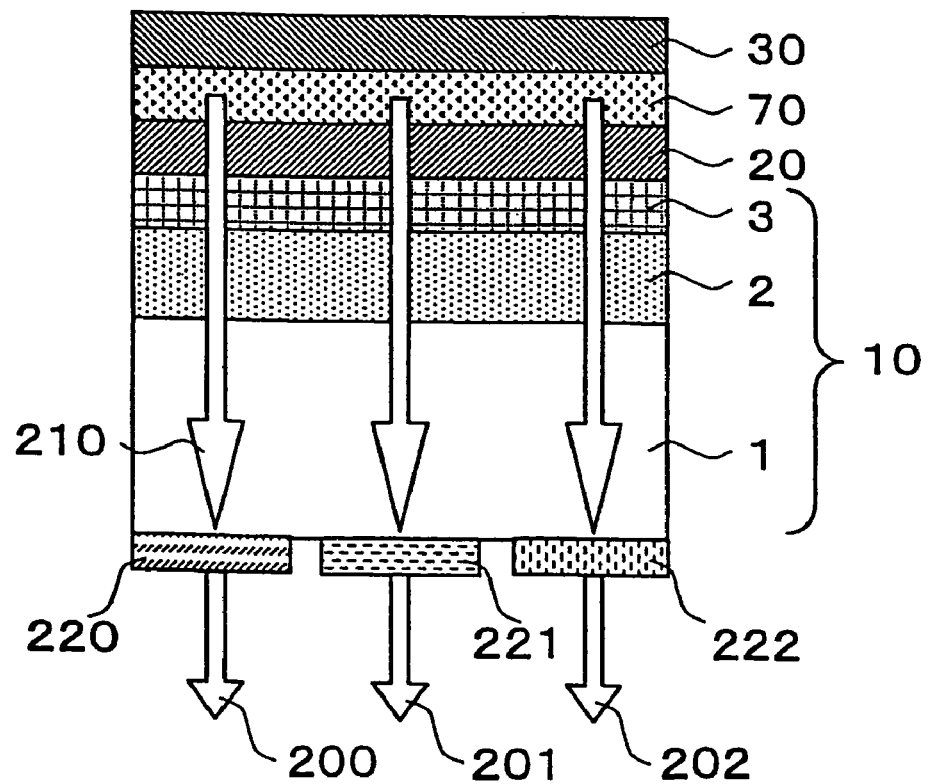
FIG. 6 shows a sectional view of another example of optical element according to the invention.

The color filter type organic EL element of FIG. 6 is provided with a red color filter 220, a green color filter 221 and a blue color filter 222 on the other face of the optical substrate 10 comprising the transparent substrate 1, the low refractive index layer 2 and the solgel film 3 than the low refractive index layer 2 side. It has a configuration in which the first electrode 20, a white light emitting layer 70 and the second electrode 30 are successively stacked over the solgel film 3. The white emitted light 210 from the white light emitting layer 70 is separated into a red emitted light 200, a green emitted light 201 and a blue emitted light 202 by the red color filter 220, the green color filter 221 and the blue color filter 222, respectively. This enables a high luminance full color element to be obtained.

Figure 7:
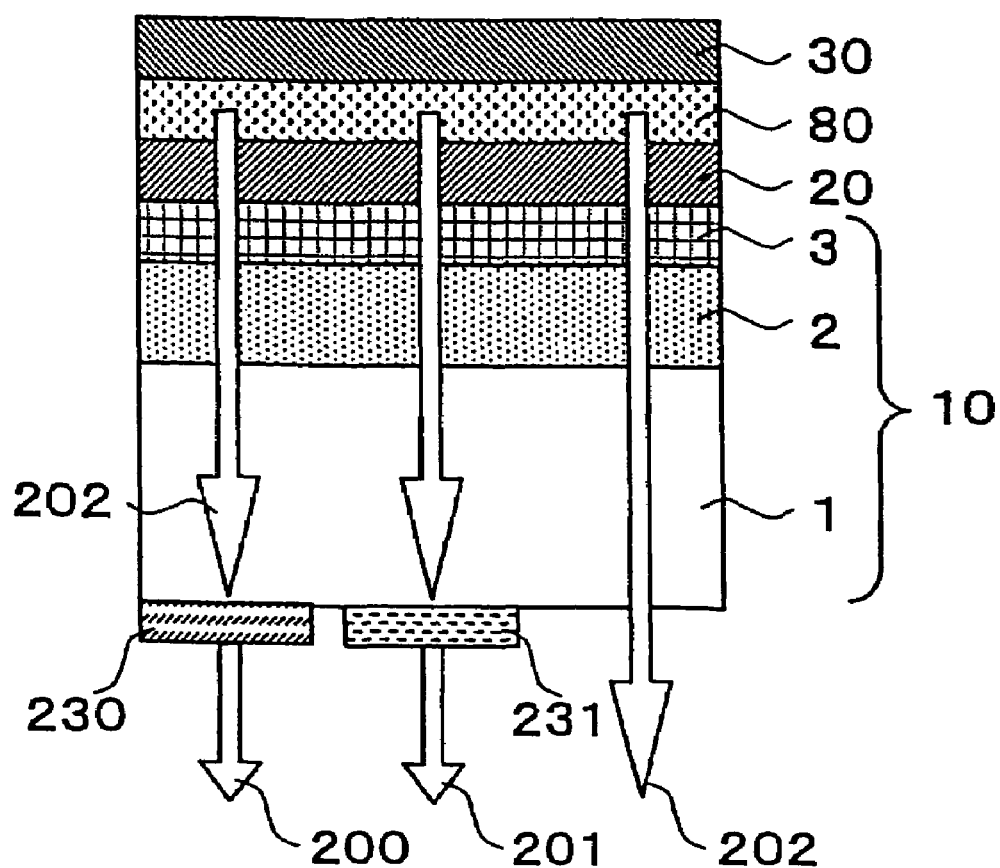
FIG. 7 shows a sectional view of another example of optical element according to the invention.

The color conversion type organic EL element shown in FIG. 7 is provided with a red conversion filter 230 and a green conversion filter 231 on the other face of the optical substrate 10 comprising the transparent substrate 1, the low refractive index layer 2 and the solgel film 3 than the low refractive index layer 2 side. It has a configuration in which the first electrode 20, the blue light emitting layer 80 and the second electrode 30 are successively stacked over the solgel film 3. The blue emitted light 202 from the blue light emitting layer 80 is converted into the red emitted light 200 and the green emitted light 201 by red conversion filter 230 and the green conversion filter 231, respectively. The blue emitted light 202 here can be emitted either as it is or after being further improved in color purity by a color filter provided specifically for this purpose.

As hitherto described, the light emitting element of this embodiment of the invention can provide a full color organic EL element having a high light emitting efficiency.

Whereas FIG. 5 through FIG. 7 shows element structures regarding the light emitting element, what is used in an actual display device comprises a light emitting element and drive means, such as a thin film transistor (TFT), provided over the transparent substrate 1.

FIG. 8 shows a sectional view of another example of organic EL display device of this embodiment. The low refractive index layer 2 and the solgel film 3 are disposed on one face of a TFT-formed substrate 110, and the first electrode 20, the organic light emitting layer 50 and the second electrode 30 matching each pixel are stacked in that order over the solgel film 3. Since the light emitting layer 50 is a very thin film, it is provided with an edge protecting layer 109 to prevent any unevenness of the edge of the first electrode 20 from inviting inter-electrode short circuiting with the second electrode 30. In the TF-formed substrate 110, reference numeral 100 denotes a pixel-driving TFT circuit unit; 101, polysilicon; 104, a gate electrode; 105, a gate oxide film; 102, a drain electrode; 103, a source electrode; 106, a first inter-layer film; 107, a second inter-layer film; and 108, a level gap easing film. The pixel-driving TFT circuit unit 100, which is an element to control light emission by the light emitting layer 50, is arranged at each of the intersections between gate lines and data lines (not shown) extending in mutually orthogonal directions. It is possible to dispose a plurality of pixel-driving TFT circuit units depending on the driving system.

In the display device of this embodiment, the level gap easing film 108 is disposed outside the area of the pixel-driving TFT circuit unit 100, in other words an area L matching the light emitting layer 50. If no level gap easing film were disposed, the area L would be made concave by the pixel-driving TFT circuit unit 100. This concave would gather liquid in the process of wet-coating the low refractive index layer 2 or the solgel film 3, giving rise to unevenness of film thickness and cracking and thereby inviting poor picture quality. This problem is solved by providing the level gap easing film 108.

In the optical substrate or the light emitting element of this embodiment, the low refractive index layer 2 can have any desired film thickness, but in the display device of the embodiment a film thickness of greater than 4 μm for the low refractive index layer 2 would make it difficult to form contact holes for connecting the source electrode 103 and the first electrode 20. In particular, a very fine display device of 130 ppi or above, where the distances between pixels is short, requires a contact hole size of less than 4 μm in order to achieve a high proportion of holes. For this reason, it is preferable for the film thickness of the low refractive index layer 2 to be not greater than 4 μm and, more preferably, 1 μm or less. With a view to enable the low refractive index layer to be fully effective, its film thickness should be not less than 0.1 μm.

As described so far, the display device embodying the invention in this mode can be a full color display device of high luminance, yet consuming less electric power.

Third Embodiment

To illustrate this embodiment of the invention, an example having a barrier layer between the solgel film and the first electrode in the light emitting element described with reference to the second embodiment will be cited.

Figure 9:
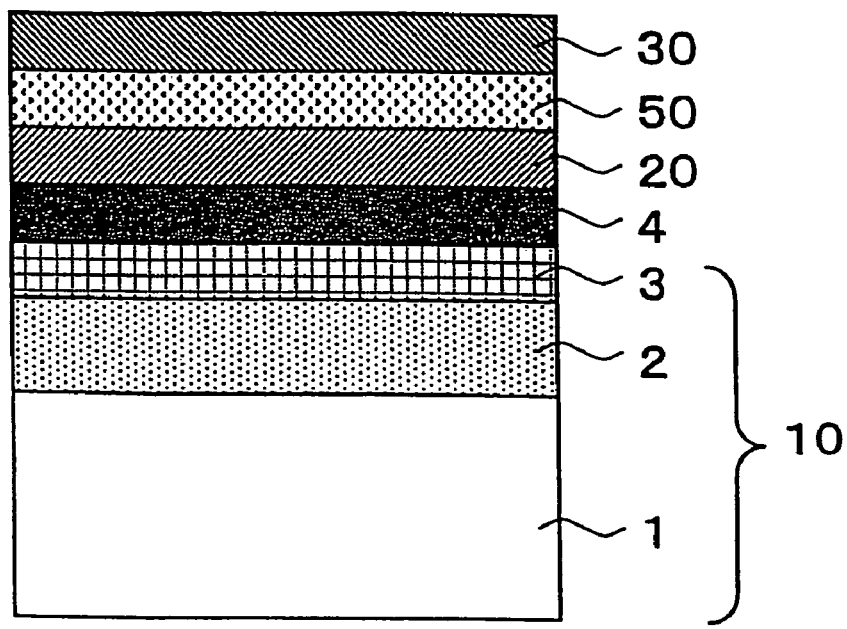
FIG. 9 shows a sectional view of another example of optical element according to the invention.

FIG. 9 shows a sectional view of one example of organic EL element of this embodiment A barrier layer 4 is arranged over the optical substrate 10, and the first electrode 20, the organic light emitting layer 50 and the second electrode 30 are successively disposed over the barrier layer 4.

Generally speaking, a solgel film, though excelling in flattening function, has a characteristic of high water absorbance, which is due to the chemical structure of the film. Many of the organic materials available for organic EL elements are readily deteriorated by moisture. For this reason, it is necessary to dehydrate the optical substrate by heating at high temperature or otherwise at the time of composing the organic material.

The barrier layer 4 has a function to confine moisture discharged from the solgel film 3. By providing the barrier layer 4, this dehydration can be either totally dispensed with or at least the hydration process can be shortened in time. This enables a high luminance full color organic EL element to be obtained at low cost.

Fourth Embodiment

To illustrate this embodiment of the invention, an example in which the optical substrate described with reference to the first embodiment is used for an inorganic electroluminescence (EL) element will be described.

Figure 10:
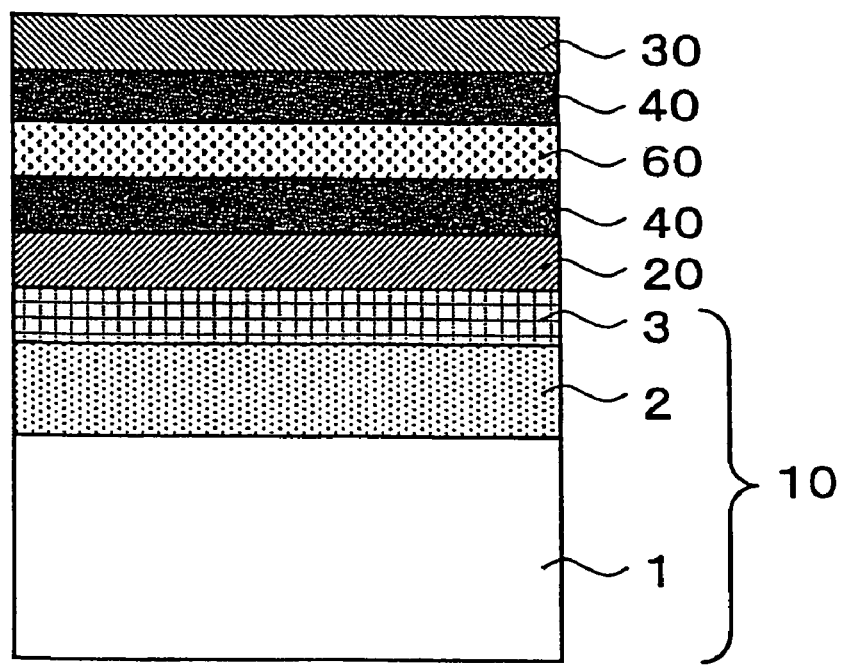
FIG. 10 shows a sectional view of another example of optical element according to the invention.

FIG. 10 shows a sectional view of one example of inorganic EL element of this embodiment. The first electrode 20, an insulating layer 40, an inorganic light emitting layer 60, another insulating layer 40 and the second electrode 30 are successively disposed over the optical substrate 10. In the inorganic EL element of this embodiment, the optical substrate is so arranged that the light emitted from the light emitting layer pass the optical substrate. Incidentally, the inorganic EL element of this embodiment can be fabricated by using known materials.

In this embodiment, the optical substrate 10 can enhance light extraction efficiency in the visible radiation range without depending on the wavelength of the emitted light. Therefore, a high-efficiency area color element or a high-efficiency full color element can be obtained by using materials independently emitting red, green and blue colors as the inorganic light emitting layer 60; a high-efficiency color filter type inorganic EL element using a white light emitting layer or a high-efficiency color conversion type inorganic EL element using a blue light emitting layer can be also obtained as described with reference to the second embodiment. This enables a high luminance full color inorganic EL element to be obtained.

EXAMPLES

The present invention will be described with reference to examples thereof. Incidentally, the invention is not limited to the following examples, but can be implemented with various appropriate modifications.

In the following examples, the light emitting characteristics of the organic EL element were measured with a luminance meter (SR-3, a product of Topcon Technohouse Corporation) arranged in the direction of the normal direction of the substrate at a condensing angle of 0.1 degree. The area of each light emitting portion of the organic EL element was 0.4 cm$^2$, and a constant current was applied to this element to measure the current-luminance efficiency at a current density of 1 mA/cm$^2$ and the element voltage working between the first electrode and the second electrode. Each element had four light emitting portions, and the measurement was taken as the average of the four points. Data from any light emitting portion where inter-electrode leaks or pixel short occurred were disregarded.

In the following examples and comparative examples, green, red and blue light emitting layers are used over a prescribed optical substrate. Comparative Example 1 will be used as the reference for green, Comparative Example 2 for red, and Comparative Example 3 for blue; the current-luminance efficiency (light emitting efficiency) counts will be relative values against a reference level of 100; and the element voltages will be relative voltage differences from the reference. The measured results are put together in Table 1.

Example 1

A non-alkali glass (OA-10, a product of Nippon Electric Glass Co., Ltd.) of 0.7 mm in thickness and 1.52 in refraction index was selected for the transparent substrate, and a silica aerogel film of 1.25 in refraction index and 0.85 µm in thickness was formed by spin coating as the low refractive index layer over one face of this transparent substrate. The surface roughness Ra1 of the low refractive index layer then was 8 nm. Next, a film of an alkoxide of silicon (T12-800, a product of Tokyo Ohka Kogyo Co., Ltd.) of 1.50 in refraction index and 0.1 µm in thickness was formed by spin coating as the solgel film over the low refractive index layer to fabricate an optical substrate. In forming the solgel film, irradiation with ultraviolet rays of 600 mJ/cm$^2$ in cumulative luminous energy was carried out. The surface roughness Ra2 of the solgel film then was 5 nm, smaller than Ra1.

Then, ITO was formed into a film by sputtering to have a sheet resistance of 15 Ω/□ or less as the first electrode over the optical substrate, and the film was wet-etched with an etchant consisting of hydrochloric acid, nitric acid and water to obtain a prescribed pattern. The ITO film was 100 nm thick and had a refraction index of 1.78. Next, a film of α-NPD (N,N'-diphenyl-N,N'-bis(α-naphthyl)-1,1'-biphenyl-4,4'-diamine) was formed by vacuum deposition as the hole injection/transport layer over the ITO film to a thickness of 50 nm. Then, to form the light emitting layer, Alq3 (tris(8-quinolinol) aluminum complex) was co-deposited with a dopant of quinacridon (in a doping concentration of 4 wt %) to a thickness of 25 nm. Next, a film of Alq3 was formed by vacuum deposition as the electron transport layer to a thickness of 35 nm. Finally, Al and U were co-deposited to a thickness of 30 nm, followed by deposition only of Al to 40 nm to form the cathode layer; a green light-emitting organic EL element was formed. As a result the current-luminance efficiency was found to be 184, and the element voltage difference, 0.4 V.

Example 2

A red light-emitting organic EL element was formed under the same conditions as Example 1 except that Alq3 (tris(8-quinolinol) aluminum complex) was co-deposited with a dopant of dicyanomethylenepyran (DCM, in a doping concentration of 5 wt %) as the light emitting layer to a thickness of 25 nm. As a result, the current-luminance efficiency was found to be 166, and the element voltage difference, 0.3 V.

Example 3

A blue light-emitting organic EL element was formed under the same conditions as Example 1 except that 4,4'-bis(2,2-diphenylvinyl) biphenyl was co-deposited as the light emitting layer to a thickness of 35 nm. As a result, the current-luminance efficiency was found to be 182, and the element voltage difference, 0.3 V.

Example 4

A non-alkali glass (OA-10, a product of Nippon Electric Glass Co., Ltd.) of 0.7 mm in thickness and 1.52 in refraction index was selected for the transparent substrate, and a silica aerogel film of 1.25 in refraction index and 0.85 µm in thickness was formed by spin coating as the low refractive index layer over one face of this transparent substrate. The surface roughness Ra1 of the low refractive index layer then was 8 nm. Next, a film of an alkoxide of silicon (T12-800, a product of Tokyo Ohka Kogyo Co., Ltd.) of 1.50 in refraction index and 0.1 µm in thickness was formed by spin coating as the solgel film to fabricate an optical substrate. In forming the solgel film, irradiation with ultraviolet rays of 600 mJ/cm$^2$ in cumulative luminous energy was carried out. The surface roughness Ra2 of the solgel film then was 5 nm, smaller than Ra1.

Then, a silicon oxide film of 1.5 in refraction index and 0.05 µm in thickness was formed as a barrier layer by CVD over the optical substrate; ITO was formed into a film by sputtering to have a sheet resistance of 15 Ω/□ or less as the first electrode over the barrier layer, and the film was wet-etched with an etchant consisting of hydrochloric acid, nitric acid and water to obtain a prescribed pattern. The ITO film was 100 nm thick and had a refraction index of 1.78. Next, a film of α-NPD (N,N'-diphenyl-N, N'-bis(α-naphthyl)-1,1'-biphenyl-4,4'-diamine) was formed by vacuum deposition as the hole injection/transport layer over the ITO film to a thickness of 50 nm. Then, to form the light emitting layer, Alq3 (tris(8-quinolinol) aluminum complex) was co-deposited with a dopant of quinacridon (in a doping concentration of 4 wt %) to a thickness of 25 nm. Next, a film of Alq3 was formed by vacuum deposition as the electron transport layer to a thickness of 35 nm. Finally, Al and U were co-deposited to a thickness of 30 nm, followed by deposition only of Al to 40 nm to form the cathode layer; a green light-emitting organic EL element was formed. As a result the current-luminance efficiency was found to be 170, and the element voltage difference, 0.1 V.

Example 5

A red light-emitting organic EL element was formed under the same conditions as Example 4 except that Alq3 (tris(8-quinolinol) aluminum complex) was co-deposited with a dopant of dicyanomethylenepyran (DCM, in a doping concentration of 5 wt %) as the light emitting layer to a thickness of 25 nm. As a result, the current-luminance efficiency was found to be 160, and the element voltage difference, 0 V.

Example 6

A blue light-emitting organic EL element was formed under the same conditions as Example 4 except that 4,4'-bis(2,2-diphenylvinyl) biphenyl was co-deposited as the light emitting layer to a thickness of 35 nm. As a result, the current-luminance efficiency was found to be 171, and the element voltage difference, 0 V.

Comparative Example 1

A green light emitting element was formed under the same conditions as Example 1 by using a transparent substrate in which neither a low refractive index layer nor a solgel film was formed. The current-luminance efficiency and the element voltage of this comparative example were used as references for the green light emitting element of each example.

Comparative Example 2

A red light emitting element was formed under the same conditions as Example 2 by using a transparent substrate in which neither a low refractive index layer nor a solgel film was formed. The current-luminance efficiency and the element voltage of this comparative example were used as references for the red light emitting element of each example.

Comparative Example 3

A blue light emitting element was formed under the same conditions as Example 3 by using a transparent substrate in which neither a low refractive index layer nor a solgel film was formed. The current-luminance efficiency and the element voltage of this comparative example were used as references for the blue light emitting element of each example.

Comparative Example 4

A non alkali glass (OA-10, a product of Nippon Electric Glass Co., Ltd.) of 0.7 mm in thickness and 1.52 in refraction index was selected for the transparent substrate, and a silica aerogel film of 1.25 in refraction index and 0.85 μm in thickness was formed by spin coating as the low refractive index layer over one face of this transparent substrate. The surface roughness Ra1 of the low refractive index layer then was 8 nm. Next, a silicon oxide film of 1.50 in refractive index and 0.1 μm in thickness was formed by sputtering over the low refractive index layer to fabricate an optical substrate. The surface roughness Ra2 of the silicon oxide film then was 8 nm, no different from Ra1. Over this optical substrate, a green light emitting organic EL element was formed under the same conditions as Example 1. As a result, the current-luminance efficiency was found to be 120, and the element voltage difference, 0.1 V. Out of the four light emitting portions, one suffered significant inter-electrode leaks, and gave no prescribed light emission.

Comparative Example 5

A non-alkali glass (OA-10, a product of Nippon Electric Glass Co., Ltd.) of 0.7 mm in thickness and 1.52 in refraction index was selected for the transparent substrate, and a silica aerogel film of 1.25 in refraction index and 0.85 μm in thickness was formed by spin coating as the low refractive index layer over one face of this transparent substrate. The surface roughness Ra1 of the low refractive index layer then was 8 nm. Next, a silicon oxide film of 1.50 in refractive index and 0.1 μM in thickness was formed by sputtering over the low refractive index layer to fabricate an optical substrate. The surface roughness Ra2 of the silicon oxide film then was 8 nm, no different from Ra1. Over this optical substrate, a red light emitting organic EL element was formed under the same conditions as Example 2. As a result, the current-luminance efficiency was found to be 116, and the element voltage difference, 0 V. Out of the four light emitting portions, two suffered significant inter-electrode leaks, and gave no prescribed light emission.

Comparative Example 6

A non-alkali glass (OA-10, a product of Nippon Electric Glass Co., Ltd.) of 0.7 mm in thickness and 1.52 in refraction index was selected for the transparent substrate, and a silica aerogel film of 1.25 in refraction index and 0.85 im in thickness was formed by spin coating as the low refractive index layer over one face of this transparent substrate. The surface roughness Ra1 of the low refractive index layer then was 8 nm. Next, a silicon oxide film of 1.50 in refractive index and 0.1 μm in thickness was formed by sputtering over the low refractive index layer to fabricate an optical substrate. The surface roughness Ra2 of the silicon oxide film then was 8 nm, no different from Ra1. Over this optical substrate, a blue light emitting organic EL element was formed under the same conditions as Example 3. As a result, the current-luminance efficiency was found to be 118, and the element voltage difference, 0.1 V. Out of the four light emitting portions, one suffered significant inter-electrode leaks, and gave no prescribed light emission.

Comparative Example 7

A non-alkali glass (OA-10, a product of Nippon Electric Glass Co., Ltd.) of 0.7 mm in thickness and 1.52 in refraction index was selected for the transparent substrate, and a silica aerogel film of 1.25 in refraction index and 0.85 μm in thickness was formed by spin coating as the low refractive index layer over one face of this transparent substrate; the optical substrate was formed. To was formed into a film by sputtering to have a sheet resistance of 15 Ω/□ or less as the first electrode over this optical substrate, and the film was wet-etched with an etchant consisting of hydrochloric acid, nitric acid and water to obtain a prescribed pattern. However, the etchant flowed round even into the area not to be etched, which was due to the porous quality of the silica aerogel film constituting the low refractive index layer, and the prescribed ITO pattern was not obtained.

TABLE 1

|  | Color of light | Light emitting efficiency | Element voltage difference | Non-emitting portions (out of four) | Remarks (1st electrode base) |
|---|---|---|---|---|---|
| Example 1 | Green | 184 | 0.4 V | 0 | Transparent substrate/low refractive index layer/solgel film |
| Example 2 | Red | 166 | 0.3 V | 0 | |
| Example 3 | Blue | 182 | 0.3 V | 0 | |
| Example 4 | Green | 170 | 0.1 V | 0 | Transparent substrate/low refractive index layer/solgel film/barrier layer |
| Example 5 | Red | 160 | 0.0 V | 0 | |
| Example 6 | Blue | 171 | 0.0 V | 0 | |
| Comparative Example 1 | Green | 100 (Reference) | — (Reference) | 0 | Only transparent substrate |
| Comparative Example 2 | Red | 100 (Reference) | — (Reference) | 0 | |
| Comparative | Blue | 100 | — | 0 | |

TABLE 1-continued

| | Color of light | Light emitting efficiency | Element voltage difference | Non-emitting portions (out of four) | Remarks (1st electrode base) |
|---|---|---|---|---|---|
| Example 3 | | (Reference) | (Reference) | | |
| Comparative Example 4 | Green | 120 | 0.1 V | 1 | Transparent substrate/low refractive index layer/sputtered silicon oxide film |
| Comparative Example 5 | Red | 116 | 0.0 V | 2 | |
| Comparative Example 6 | Blue | 118 | 0.1 V | 1 | |
| Comparative Example 7 | — | Evaluation impossible | Evaluation impossible | 4 | Transparent substrate/low refractive index layer |

The present invention hitherto described can be utilized for light emitting elements for use in organic EL elements, inorganic EL elements, light emitting diode elements, plasma display elements and so forth; and display devices.

What is claimed is:

1. An optical substrate comprising:
   a transparent substrate;
   a low refractive index layer, whose refractive index is lower than that of the transparent substrate, disposed over the transparent substrate; and
   a solgel film disposed over the low refractive index layer, a relationship between the surface roughness of the low refractive index layer, represented by Ra1, and that of the solgel film over the low refractive index layer, represented by Ra2, being defined as Ra1>Ra2, said solgel film having in its infrared absorption spectrum an absorption A of 1107±2 cm−1 in wave number attributable to Si—O—C, an absorption B of 1070±2 cm−1 in wave number attributable to Si—O—Si, and an intensity ratio A/B between the absorption A and the absorption B ranging from 0.5 to 1.0.

2. The optical substrate according to claim 1, wherein the refraction index of said low refractive index layer ranges from 1.003 to 1.400.

3. The optical substrate according to claim 1, wherein said low refractive index layer is silica aerogel layer.

4. The optical substrate according to claim 1, wherein said solgel film has an Si—O—C structure.

5. The optical substrate according to claim 1, wherein the refraction index of said solgel film is greater than that of said low refractive index layer.

6. The optical substrate according to claim 1, wherein the thickness of said solgel film ranges from 0.05 to 1.0 mm.

7. The optical substrate according to claim 1, wherein said solgel film is formed by using a precursor having an Si—H group.

8. The optical substrate according to claim 1, wherein said transparent substrate is a plastic substrate.

9. The optical substrate according to claim 1, wherein a baffler layer is further disposed over said solgel film.

10. The optical substrate according to claim 1, wherein said transparent substrate is a substrate provided with a thin film transistor.

11. A light emitting element comprising:
    a transparent substrate;
    a low refractive index layer, whose refractive index is lower than that of the transparent substrate, disposed over the transparent substrate;
    a solgel film disposed over the low refractive index layer, a relationship between a surface roughness of the low refractive index layer, represented by Ra1, and that of the solgel film over the low refractive index layer, represented by Ra2, being defined as Ra1>Ra2 said solgel film having in its infrared absorption spectrum an absorption A of 1107±2 cm−1 in wave number attributable to Si—O—C, an absorption B of 1070±2 cm−1 in wave number attributable to Si—O—Si, and an intensity ratio A/B between the absorption A and the absorption B ranging from 0.5 to 1.0;
    a first electrode over the solgel film;
    a light emitting layer over the first electrode; and
    a second electrode over the light emitting layer.

12. The light emitting element according to claim 11, wherein the refraction index of said low refractive index layer ranges from 1.003 to 1.400.

13. The light emitting element according to claim 11, wherein said low refractive index layer is silica acrogel layer.

14. The light emitting element according to claim 11, wherein said solgel film has an Si—O—C structure.

15. The light emitting element according to claim 11, wherein the refractive index of said solgel film is greater than that of said low refractive index layer.

16. The light emitting clement according to claim 11, wherein the thickness of said solgel film ranges from 0.05 to 1.0 mm.

17. The light emitting element according to claim 11, wherein said solgel film is formed by using a precursor having an Si—H group.

18. The light emitting element according to claim 11, wherein said transparent substrate is a plastic substrate.

19. The light emitting element according to claim 11, wherein a barrier layer is further disposed over said solgel film and said first electrode is disposed over the barrier layer.

20. The light emitting element according to claim 11, wherein said transparent substrate is a substrate provided with a thin film transistor.

21. The light emitting element according to claim 11, wherein said transparent substrate is provided with a color conversion filter.

22. The light emitting element according to claim 11, wherein said transparent substrate is provided with a color filter.

23. The light emitting element according to claim 11, wherein said light emitting element is an organic electroluminescence element.

24. The light emitting element according to claim 11, wherein light emission from said light emitting layer is monochromatic.

25. The light emitting element according to claim 24, wherein said monochromatic light is white light.

26. The light emitting element according to claim 24, wherein said monochromatic light is blue light.

27. A display device comprising the light emitting element according to claim 11 and means for driving the light emitting element, which are disposed over the transparent substrate.

28. The display device according to claim 27, wherein the film thickness of said low refractive index layer is 4 mm or less.

29. The display device according to claim 27, wherein said means for driving is a thin film transistor.

30. The display device according to claim 29, further comprising a level gap easing film for easing a convex attributable to said thin film transistor.

31. A light emitting element comprising:
   a transparent substrate;
   a low refractive index layer, whose refractive index is lower than that of the transparent substrate, disposed over the transparent substrate;
   a solgel film disposed over the low refractive index layer, said solgel film has in its infrared absorption spectrum an absorption A of 1107±2 cm−1 in wave number attributable to Si—O—C and an absorption B of 1070±2 cm−1 in wave number attributable to Si—O—Si, and the intensity ratio A/B between the absorption A and the absorption B ranges from 0.5 to 1.0;
   a first electrode over the solgel film;
   a light emitting layer over the first electrode; and
   a second electrode over the light emitting layer.

32. An optical substrate comprising:
   a transparent substrate;
   a low refractive index layer, whose refractive index is lower than that of the transparent substrate, disposed over the transparent substrate; and
   a solgel film disposed over the low refractive index layer, said solgel film has in its infrared absorption spectrum an absorption A of 1107±2 cm−1 in wave number attributable to Si—O—C and an absorption B of 1070±2 cm−1 in wave number attributable to Si—O—Si, and the intensity ratio A/B between the absorption A and the absorption B ranges from 0.5 to 1.0.

* * * * *